United States Patent Office 3,275,437

Patented Sept. 27, 1966

3,275,437

IMAGE TRANSFER PROCESS AND ELEMENTS THEREFOR

Abraham Bernard Cohen, Springfield, N.J., assignor to E. I. du Pont de Nemours and Company, Wilmington, Del., a corporation of Delaware No Drawing. Filed Jan. 24, 1963, Ser. No. 253,759
20 Claims. (Cl. 96—29)

This invention relates to an image reproduction process and more particularly to a process for selectively transferring images from photopolymerized image-bearing elements to a new receptor support and to elements therefor.

Various processes for producing copies of an image involving thermal transfer are known. In some of the commercially promising processes, the transfer (a) is preceded by a wet development step (Abbott U.S.P. 3,012,885), (b) is accomplished in a wet system, or (c) water-yielding materials are present in addition to light-sensitive materials. A practical dry process for thermally transferring images is disclosed in Burg and Cohen U.S.P. 3,060,023, Oct. 23, 1962. In the process of this patent, underexposed photopolymerizable image areas are transferred thermally by selective adhesion of said image areas to the surface of a receptor support.

An object of this invention is to provide a new, simple and dependable image transfer process. Another object is to provide such a process which utilizes simple and economical apparatus and image forming elements. Still another object is to provide a practical dry transfer process in which a colorant, e.g., a dye or a color-forming compound, is selectively transferred by diffusion from the underexposed areas of an imagewise photopolymerized layer to the surface of a receptor sheet. Still further objects will be apparent from the following description of the invention.

In its broader aspects, the thermal image transfer process of this invention comprises:

A. Placing into interfacial contact the surfaces of an image-receptive element and an addition polymerizable solid layer consisting of (1) Underexposed areas in said solid layer comprising (*x*) at least one non-gaseous ethylenically unsaturated compound containing at least one terminal ethylenic group, having a boiling point above 100° C. at normal atmospheric pressure and being capable of forming a high polymer by photoinitiated addition polymerization, and (*y*) A diffusible colorant, which when referred to in the specification and claims as "colorant," "diffusible colorant," "color component" or "color-forming component" shall mean a non-polymerizable dye or color forming compound, free from polymerizable ethylenic groups, that diffuses at a temperature below that at which said layer becomes tacky and adherent to bond paper; and (2) Complementary adjoining coplanar exposed image areas, (i.e., reverse image areas) comprising an addition polymer of the aforesaid compound and said colorant, and B. Heating at least one of the elements while they are in surface contact to a temperature sufficient for the colorant to diffuse through the layer but below that at which the layer becomes tacky and adherent to said image-receptive element.

In a preferred aspect the process comprises:

A. Placing into interfacial contact the surfaces of an image-receptive element and an addition polymerizable solid layer consisting of (1) Underexposed areas in said solid layer comprising (a) At least one non-gaseous ethylenically unsaturated compound containing at least one terminal ethylenic group having a boiling point above 100° C. at normal atmospheric pressure and being capable of forming a high polymer by photoinitiated addition polymerization, (b) A polymeric binder having a tack temperature at least as high as the layer, (c) A diffusible colorant, e.g., a dye or color former that diffuses at a temperature below that at which said layer becomes tacky and adherent to bond paper; and (2) Complementary adjoining coplanar exposed image areas, (i.e., reverse image areas) comprising an addition polymer of the aforesaid monomer and said colorant, and B. Heating at least one of the elements while they are in surface contact to a temperature sufficient for the colorant to diffuse through the layer but below that at which the layer becomes tacky and adherent to said image-receptive element, and C. Separating the two elements.

In this process the polymeric binder may contain addition polymerizable terminal ethylenic groups.

The solid layer in both above processes preferably also contains (d) An addition polymerization initiator activatable by actinic light and inactive thermally below 85° C.; and, if desired, (e) A thermal addition polymerization inhibitor and/or (f) A chain transfer agent (as described in Barney et al. U.S.P. 3,046,127).

The foregoing constituents (a) and (b) are initially present in the solid layer, that is, before imagewise polymerization, in amounts from 3 to 97 and 97 to 3 parts by weight. Constituent (c) is present in an amount from 0.001 to 1.0 part by weight and constituents (d) and (e) are present in amounts from 0.001 to 10.0 and 0.001 to 2.0 parts by weight, respectively.

The term "underexposed," as used herein, is intended to cover the image areas which are completely unexposed or partially exposed so that there is a material amount of the addition polymerizable compound still present and insufficient addition polymer image has been formed to decrease the solubility of the dye in the photopolymerizable composition or to prevent the dye or dye forming component from diffusing to the image-receptive element.

In carrying out the process of the invention, there are two temperature conditions which should be taken into account. These temperatures are as follows:

$T_t$=A tack temperature of the surface of the underexposed (including unexposed) areas of the photopolymerizable element at which temperature said surface becomes tacky or softens or melts and becomes adherent to the surface of a receptor, e.g., a sheet of paper.

$T_0$=An operating temperature, i.e., colorant diffusion and transfer temperature or range of temperature over which transfer of colorant from the underexposed areas to a receptor takes place.

The elements of the invention can be provided (a) with a thin, protective stratum that is permeable to the diffusible colorant or that melts at or below the tack temperature, (b) with a stratum of the type described in assignee's Burg U.S. application Ser. No. 234,214 filed Oct. 30, 1962, now U.S. Patent No. 3,203,805 or (c) with a strippable cover sheet of the type described in Heiart U.S.P. 3,060,026, Oct. 23, 1962.

In general, the photopolymerizable compositions are not thermally polymerizable within 0.5 second at temperatures below the softening or melting point of the composition.

In an embodiment of this invention, the polymeric component (b) can be replaced in whole or in part by filler materials which are immiscible with the ethylenically unsaturated monomeric component (a). Examples of such materials include organophilic silicas, bentonites, silica, powdered glass, baryta, synethtic latices, etc.

In another embodiment, the immiscible polymeric compound can be the support of the element which is imbibed with a solution of the photopolymerizable composition. Suitable such base materials are, e.g., cellulose such as paper, felt, fabrics, etc.; porous materials such as polyurethane and polystyrene foams; permeable materials such as gelatin, polyvinyl alcohol, etc., and others.

The image forming process of this invention comprises:

(i) Exposing, imagewise, with actinic light a photopolymerizable element comprising a support bearing a solid photopolymerizable layer comprising (a) At least one non-gaseous, ethylenically unsaturated compound containing at least one terminal ethylenic group, having a boiling point above 100° C. at normal atmospheric pressure and being capable of forming a high polymer by photo-initiated addition polymerization; and, if desired, (b) A polymeric binder which does not become tacky or transfer to a receptor surface at 150° C.–300° C., and (c) A diffusible colorant, e.g., a dye or color former that diffuses at a temperature between 50° C. and 300°C. and below the temperature at which said layer becomes tacky and adherent to bond paper;

(ii) Placing the surface of the exposed layer into contact with the image-receptive surface of a separate element;

(iii) Heating at least one of the elements while they are in surface contact to a temperature $T_0$ below that at which the layer becomes tacky and adheres to a receptive surface and below the decomposition temperature of the materials of the layer, and (iiii) Separating the contacting surface of the two elements.

In the foregoing process, the imagewise exposure to actinic light is continued until substantial addition polymerization takes place in the exposed areas to form addition polymer while no significant polymerization takes place in the underexposed areas. The exposure can be made to actinic radiation transmitted through a pattern, e.g., line, halftone or continuous tone photographic negative or positives, a cutout stencil, etc., or to light reflected from a suitable pattern by reflectographic exposure. After the exposure, the image-bearing layer is brought into intimate contact with the surface of a receptor, e.g., paper, metal polymer, etc., during which time the element is heated in the range of 50 to 300° C. or more, and while still warm the surfaces are separated. The color or color-forming component alone or together with some monomer diffuses to the receptor support in the areas corresponding to the unexposed or least exposed areas to give at least one duplicate copy of the original positive, negative or original image. Multiple copies can be obtained by repeating the heat transfer procedure using appropriate coating thicknesses of the photosensitive layer and temperatures to give the desired number of copies. By varying the dye concentration, variations in the number of copies can be attained.

In a preferred aspect of the invention, the photopolymerizable composition used to make the photopolymerizable layer comprises:

(a) An ethylenically unsaturated compound, e.g., a compound having one or more acrylic or methacrylic groups attached to a glycol of 1 to 10 carbon atoms or a polyethylene glycol of molecular weight from about 100 to 500 or a polyhydroxy compound such as pentaerythritol.

(b) A high melting polymer, e.g., gelatin, polyvinyl alcohol, cellulose esters and ethers, polyacrylamides, polyacrylates, polymethacrylates;

(c) A diffusible dye;

(d) A photoinitiator capable of initiating addition polymerization but which is inactive thermally below 185° C., e.g., 9, 10-anthraquinone, 2-ethylanthraquinone, 9, 10-phenanthrenequinone, etc.

(e) A thermal addition polymerization inhibitor, e.g., p-methoxyphenol, which layer has a thickness, when dry, of about 0.1 to about 10 mils.

In an exemplary procedure, the foregoing layer on a flexible film support, e.g., a copolymer coated polyethylene terephthalate film base as described in Alles et al. U.S. 2,627,088, is exposed through a photographic transparency to actinic radiation whereby addition polymerization takes place in the exposed areas but not in the unexposed areas. A receptor support, preferably white paper, is brought in contact with the exposed and imagewise photopolymerized element. The sandwich formed is heated at a temperature of 50 to 300° C. for 0.1 to 60 seconds, preferably 80 to 240° C. for about 1 to 10 seconds, and the element and receptor support separated. The dye in the unexposed image areas diffuses and transfers to the receptor support. Multiple copies can be prepared using the above procedure and a new receptor support for each copy.

In another procedure, the dye is replaced by an inorganic or organic dye forming or color forming component. The transferred image is made visible by "developing", i.e., reacting with a suitable compound to form a dye of high extinction coefficient.

In a still further procedure, the transferred material is of hydrophobic nature and is transferred to a hydrophillic surface to give a printing plate suitable for offset printing.

This invention will be further illustrated by, but is not intended to be limited to the following examples:

*Example I*

A photopolymerizable composition was prepared by mixing 1.0 g. of a cellulose acetate polymer containing 52.0 to 52.8% combined acetic acid, having a viscosity of 30 to 50 seconds as determined by ASTM procedure D871–48, Formula A, dissolved in 11 g. of acetone, 1.56 g. of polyethylene glycol diacrylate (average molecular weight of diol precursor 300), and 0.0016 g. of anthraquinone. To the photopolymerizable solution there was added 0.003 g. of a violet dye, 1-anilino-4-hydroxyanthraquinone. The photopolymerizable solution containing the dye was coated on a 1.5-mil thick polyethylene terephthalate film and dried in absence of actinic radiation. The dry coating was 0.3-mil thick. The surface of said coating was brought in contact, in a vacuum frame, with a photographic positive transparency containing line and letter text images, and the photopolymerizable layer was exposed through the transparency to 1.75 watts of actinic radiation per square inch for 1 second by means of a 1,800-watt high pressure mercury-arc light placed 1 inch from the photopolymerizable surface. After removing the exposed element from the vacuum frame, the element was separated from the photographic transparency and brought in intimate contact with a sheet of white paper. The sandwich formed was heated through the film support by bringing a flat metal surface preheated to 150° C. into contact with the film support for 10 seconds. Upon separation of the two sheets, a violet colored copy of the original image remained on the paper sheet as a result of diffusion of the dye and monomer from the unexposed (unpolymerized) areas to the paper. The above described procedure was repeated except that the dye obtained by coupling diazotized 4-amino-3-nitrotoluene with 3-methylpyrazolone and Fuchsin (CI 42510), respectively, were added to the photopolymerizable solution. Comparable results were obtained as with the violet dye.

*Example II*

A photopolymerizable composition was prepared by mixing 1.1 g. of a cellulosic ether polymer having 28 to 30% methoxyl groups and 7 to 12% hydroxypropoxyl groups and a viscosity of 50 centipoises for a 2% by weight aqueous solution, 15 cc. of methanol, 2 cc. of water, 2 g. of polyethylene glycol diacrylate described in Example I and 0.002 g. of anthraquinone. To the photopolymerizable mixture there was added 0.008 g. of Calcocid Green S (CI 44090), extra concentrated, dissolved in 4 cc. of water. The photopolymerizable composition was then coated to a depth of 5 mils on a 1-mil thick polyethylene terephthalate film and was allowed to dry. A 0.5-mil thick photopolymerizable layer remained on the film support. The exposure and transfer procedures described in Example I were used except that the flat, metal surface was preheated to 100° C. A green colored copy of the orginal transparency was obtained on the paper support.

*Example III*

A photopolymerizable composition was prepared by mixing 1 g. of a polyvinyl alcohol polymer (88% hydrolyzed) having a viscosity of 4 to 6 centipoises for a 4% by weight water solution at 20° C. determined by means of the Hoeppler "falling ball" method, 6 cc. of ethanol, 4 cc. of water, 1 g. of polyethylene glycol diacrylate described in Example I and 0.002 g. of phenanthrenequinone. To the photopolymerizable composition was added 0.001 g. of a violet dye, 1-anilino-4-hydroxyanthraquinone and the dye-containing composition was coated to a wet thickness of 7 mils on a 4-mil thick sheet of polyethylene terephthalate film bearing a subcoat of a copolymer of vinylidene chloride/methyl acrylate/itaconic acid as disclosed in Alles et al. U.S. Patent 2,627,088. The coating was dried and a 2.5-mil thick photopolymerizable layer remained on the film. This layer was exposed through a photographic positive transparency to 1.75 watts of actinic radiation per square inch for 5 seconds as described in Example I. The photopolymerized element was brought into intimate contact with a sheet of white bond paper, and the sandwich formed was heated through the film base for 3 seconds by means of a flat, metal surface preheated to 140° C. The photopolymerized element was separated from the paper and a violet colored reproduction of the original photographic transparency was formed on the paper. The heating and transfer operations were repeated three times using a new sheet of paper each time. Three duplicate copies of satisfactory quality were obtained. The 140° temperature was well below the tack temperature ($T_t$) of the photopolymerizable layer. After making 3 copies there was an imagewise reduction in optical density but no indication of a relief image and no apparent transfer of binder from the layer.

*Example IV*

A photopolymerizable composition was prepared by mixing 1 g. of N-methoxymethyl polyhexamethylene adipamide having an intrinsic viscosity of about 1, having methoxymethyl group on 45% of the amido nitrogen atoms, and having a softening temperature of 135 to 140° C., 5 cc. of ethanol, 1.5 g. of tetramethylene dimethacrylate, 0.015 g. of benzoin methyl ether and 0.05 g. of the violet dye described in Example I. The photopolymerizable composition was coated to a wet thickness of 11 mils on 4-mil polyethylene terephthalate film subcoated as described in Example III. The photopolymerizable coating dried to a thickness of 1.9 mils and was then exposed as described in Example I to 1.75 watts of actinic radiation per square inch for 4 seconds using the light source described in that example. A sheet of white paper was brought into intimate contact with the photopolymerized layer and the sandwich was heated through the film base for 3 seconds by means of a metal surface preheated at 140° C. The heating and transfer operations were repeated four times using a new paper support for each transfer. Four satisfactory duplicate copies of the original transparency were obtained.

*Example V*

A solution of 3.4 g. of pentaerythritol tetraacrylate, 0.003 g. of p-methoxyphenol, 0.004 g. of p-nitrosodiethylaniline, 4 cc. of acetone and 0.005 of Crystal Violet (C.I. 42555), was added to a solution of 1.0 g. of triethylene glycol diacetate, 0.05 g. of phenanthrenequinone, 14 cc. of acetone and 1.5 g. of cellulose acetate acrylate having 2.4 acetate groups and 0.03 acrylate groups per glucose unit. The solution weight was brought to 21.0 g. with acetone. A coating on a 1-mil thick polyethylene terephthalate film base was prepared and dried under safelight conditions. A 1-mil thick polyethylene terephthalate cover sheet was then pressure laminated to the dry coating. This element was exposed reflectographically for six seconds to a black message printed on a white paper, using a 20-watt, blue, fluorescent light source. The cover sheet was then removed and the surface of the exposed coating was contacted with a sheet of white paper. The sandwich was then passed between two rollers one of which was preheated to 75° C. and the sheets were separated as they emerged from the rollers. A copy of the original image resulting from the transfer of dye and monomer from the underexposed areas was obtained on the paper support.

The process was repeated at transfer temperatures up to 150° C. The results were similar.

*Example VI*

A solution of a photopolymerizable composition was prepared by dissolving in a mixture of 1 cc. of methanol and 19 cc. of acetone, 1.8 g. of pentaerythritol tetraacry late, 0.6 g. of triethyleneglycol diacrylate, 1.0 g. of polyvinyl acetate methacrylate containing a maximum of 10 mole percent methacrylyl groups, 0.8 g. of cellulose acetate (55% combined acetic acid, ASTM viscosity 24 seconds), 0.024 g. of phenanthrenequinone, 0.0024 g. of p-methoxyphenol, 0.0012 g. of p-nitrosodiethylaniline and 0.008 g. of Crystal Violet. A coating was prepared and provided with a transparent cover sheet as described in Example V. A reflectographic exposure to a black printed message on a white paper was made through a 0.76 neutral density filter, using a 140 amp. high intensity carbon arc lamp providing an actinic intensity of 0.02 watts per square cm. Using the procedure of Example V, a copy of the printed message, resulting from diffusion of dye and monomer from the underexposed areas to the receptor sheet was obtained.

*Example VII*

A solution of a photopolymerizable composition was prepared by dissolving in a mixture of 1 cc. of methanol and 19 cc. of acetone, 1.0 g. of polyvinyl acetate methacrylate containing a maximum of 10% of methylacrylyl groups, 0.8 g. of cellulose acetate (55% combined acetic acid, ASTM viscosity 24 seconds), 1.8 g. of triethylene glycol, 0.024 g. of phenanthrenequinone, 0.0024 g. of p-methoxyphenol and 0.008 g. of Crystal Violet. This solution was coated on a polyethylene terephthalate film and provided with a transparent cover sheet as described in Example V. The cover sheet was placed in contact with a positive, photographic line transparency and exposed through the transparency for 3 seconds to the light of a high pressure mercury-arc light described in Example I. Using the transfer procedure of Example V, a copy of the photographic transparency was obtained on a white receptor paper, resulting from diffusion of dye and plasticizer (triethylene glycol) from the underexposed areas of the layer to the receptor sheet.

*Example VIII*

Example II was repeated, except that the green dye was replaced by 0.025 g. of p-dimethylaminobenzaldehyde dissolved in 1 ml. of methanol. After exposure, the surface of the element was contacted with a sheet of white paper which had previously been saturated with a 20% solution in ethanol of p-diethylaminoaniline hydrochloride and dried. The sandwich was heated to 130° C. for about 5 seconds, and the two surfaces were separated. An orange-pink colored image remained on the receptor layer, corresponding to the image areas of the transparency.

*Example IX*

Example V was repeated, except that the transfer was made to a thin aluminum plate having a hydrophilic surface. After transfer, a clearly visible image remained on the aluminum support. This image was then post-exposed for about 10 seconds with a 20-watt, blue, fluorescent light source in order to polymerize the transferred monomeric compound. The so-treated image was hydrophobic and was firmly attached to the hydrophilic aluminum surface. The aluminum plate was used in an ordinary offset printing press and produced images of good quality.

*Example X*

To 27 g. of a solution of cellulose acetate prepared by dissolving 20 g. of cellulose acetate, having 2.4 acetate groups per anhydroglucose unit and combined acetic of 55%, in a mixture of 150 cc. acetone, and 50 cc. methanol there were added 0.89 g. of polyethylene glycol diacrylate derived from polyethylene glycol of average molecular weight 400, 0.04 g. of phenanthrenequinone and 0.8 g. of the dye, Spirit Soluble Fast Blue HFL (C.I. 74360). The mixture was coated to a dry thickness of 0.6 mil on a 1-mil-thick polyethylene terephthalate film base and dried for one hour under conditions of darkness. The coated film was placed in a vacuum frame, the coating being in contact with an image-bearing photographic transparency, vacuum was applied and the coating was exposed through the transparency for 10 minutes to a 500-watt photoflood lamp placed at a distance of about six inches above the transparency. The exposed element was removed and the coating was then placed in contact with a sheet of bond paper. The resulting contacting elements were then passed between two rollers one of which was preheated to 230° C., with the paper contacting the hot roll. Upon emergence from the roller, the paper was separated from the photopolymer coating. A blue copy of the original message was formed on the paper by transfer of dye and monomer from the underexposed portion of the original photopolymerizable coating. By repeating the thermal transfer process, two more copies were prepared.

*Example XI*

The following ingredients were brought together and vigorously stirred to form a coating solution:

7.0 g. of a 27% by weight solution in methyl ethyl ketone of a copolyester corresponding to the esterification product of ethylene glycol and dimethyl hexahydroterephthalate, dimethyl sebacate and dimethyl terephthalate as described in Burg U.S. 3,036,913.
18.6 g. of a 24% by weight solution in methyl ethyl ketone of a polymethylmethacrylate polymer having an intrinsic viscosity of 0.74 (0.5% by weight solution in diethyl ketone at 35° C.) and a polymer melt temperature of 146° C. (determined according to the procedure given at page 49 of Preparative Methods of Polymer Chemistry, Sorenson & Campbell, Interscience, New York, 1961).
4.4 g. pentaerythritol triacrylate
0.8 g. polyethylene oxide of molecular weight 4000
0.2 g. "Pontacyl" Wool Blue Dye (C.I. Acid Blue 59)
80.0 g. final weight, adjusted by addition of acetone.

The above solution was coated on a 0.001 inch-thick polyethylene terephthalate film base support to a dry thickness of about 0.0006 inch in thickness. Over this coating there was laminated another sheet of 0.001 inch-thick polyethylene terephthalate to serve as an oxygen barrier layer. The coating was exposed, through a continuous tone positive transparency in a contact printing frame, for two seconds to a 140-ampere carbon-arc placed at a distance of 16 inches. After exposure, the laminated cover sheet was stripped away and the coating was placed in contact with a sheet of glossy, smooth paper and the sandwich thus formed was pressed between heated rollers, as described in Example V, with the roller temperature being adjusted to 110° C. The resulting copy produced on the paper receptor sheet was an excellent continuous-tone positive. It is believed that the exposure was sufficient to cause at least partial polymerization over the entire area of the photopolymerizable coating, with a greater degree of polymerization occurring in the more heavily exposed areas. This difference in degree of polymerization apparently controlled the amount of the blue dye which could diffuse through to the receptor surface to form the continuous-tone reproduction.

Suitable addition polymerizable ethylenically unsaturated compounds which can be used in this invention include unsaturated esters of polyols, particularly such esters of the alpha-methylene carboxylic acids, e.g., ethylene diacrylate, diethylene glycol diacrylate, glycerol diacrylate, glycerol triacrylate, mannitol polyacrylate, sorbitol polyacrylates, ethylene dimethacrylate, 1,3-propanediol dimethacrylate, 2,4-butanetriol trimethacrylate, 1,4-cyclohexanediol diacrylate, 1,4-benzenediol dimethacrylate, pentaerythritol di-, tri-, and tetramethacrylate, pentaerythritol di-, tri- and tetraacrylate, dipentaerythritol polyacrylate, 1,3-propanediol diacrylate, 1,5-pentanediol dimethacrylate, the bis-acrylates and methacrylates of polyethylene glycols of molecular weight 200–4000, and the like; unsaturated amides, particularly those of the alpha-methylene carboxylic acids, and especially those of alpha, omega-diamines and oxygen-interrupted omega-diamines, such as methylene bis-acrylamide, methylene bis-methacrylamide, ethylene bis-methacrylamide, 1,6-hexamethylene 1,2-diacrylamide, diethylene triamine tris-methacrylamide, bis (epsilon-methacrylamidopropoxy) ethane, 2-methacrylamidoethyl methacrylate, N - (beta - hydroxyethyl-beta-(methacrylamido)ethyl acrylate and N,N-bis (beta-methacrylyloxyethyl)acrylamide; vinyl esters such as divinyl succinate, divinyl adipate, divinyl phthalate, divinyl terephthalate, divinyl benzene-1,3-disulfonate, and divinyl butane-1,4-disulfonate; and unsaturated aldehydes, such as sorbaldehyde (hexadienal). An outstanding class of these preferred addition polymerizable components are the esters and amides of $\alpha$-methylene carboxylic acids and substituted carboxylic acids with polyols and polyamines wherein the molecular chain between the hydroxyls and amino groups is solely carbon or oxygen-interrupted carbon. The preferred monomeric compounds have more than one ethylenically unsaturated group. The amount of monomer added varies with the particular polymer used. Preferably the viscosity of the monomeric compound decreases rapidly with increased temperature and the viscosity increases rapidly as the monomer polymerizes.

Polymeric components useful in the invention which are non-tacky at the transfer temperature include: cellulose, cellulose esters, cellulose ethers, polyvinyl alcohol, polyvinyl alcohol-formaldehyde and -butyraldehyde acetals, N-methoxy-methyl polyhexamethylene adipamide, gelatin, polyurethane, natural and synthetic rubbers, etc.

The monomer and polymer functions can be combined in a single material which is then a polymerizable binder. Suitable such materials include compounds in which the ethylenic unsaturation is present as an extralinear substituent attached to a linear polymer, such as cellulose acetate acrylate, cellulose acetate methacrylate, polyvinyl acetate acrylate, polyvinyl acetate methacrylate, N-acrylyloxymethylpolyamide, N-methacrylyloxymethylpolyamide, allyloxymethylpolyamide, etc. These compounds may be used in conjunction with a suitable, inert, plasticizer, e.g., glycerol, ethylene glycol, polyethylene glycol, which can diffuse from the underexposed areas of the polymerizable layer to the receptor sheet.

A preferred class of addition polymerization initiators activatable by actinic light and thermally inactive at and below 85° C. are the substituted or unsubstituted polynuclear quinones, which compounds have two intracyclic carbonyl groups attached to intracyclic carbon atoms in a conjugated six membered carbocyclic ring, there being at least one aromatic carbocyclic ring fused to the ring containing the carbonyl groups. Suitable such initiators include 9,10 - anthraquinone, 1 - chloranthraquinone, 2-chloroanthraquinone, 2 - methylanthraquinone, 2 - tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone alpha-sulfonic acid, 3-chloro-2-methylanthraquinone, retenequinone, 7,8,9,10-tetrahydronaphthacenequinone, and 1,2,3,4-tetrahydrobenz [a] anthracene-7,12-dione. Other photo-initiators which are also useful include vicinal ketaldonyl compounds, such as diacetyl, benzil, etc.; α-ketaldonyl alcohols, such as benzoin, pivaloin, etc.; acyloin ethers, such as benzoin methyl or ethyl ethers, etc.; α-hydrocarbon substituted aromatic acyloins, including β-methylbenzoin, α-allylbenzoin, and α-phenylbenzoin.

Suitable thermal polymerization inhibitors that can be used in addition to the preferred p-methoxyphenol include hydroquinone, and alkyl and aryl-substituted hydroquinones, tert-butylcatechol, pyrogallol, copper resinate, naphthylamines, beta-naphthol, cuprous chloride, 2,6-di-tert-butyl-p-cresol, phenothiazine pyridine, nitrobenzene and dinitrobenzene. Other useful inhibitors include p-toluquinone and chloranil.

The colorants useful in the invention are thermally diffusible in the photopolymerizable composition. Preferably the colorants should have a high degree of solubility in the ethylenically unsaturated monomeric compound, a high volatility and a poor affinity for the binder. Suitable colorants of this type are dyes such as Fuchsin (CI 42510), Calocid Green A (CI 44090), 1-anilino-4-hydroxyanthraquinone, 3' - hydroxyquinophthalone, the monoazo dye obtained by diazotizing 4-amino-3-nitrotoluene and coupling it with 3-methylpyrazolone, and others. Other suitable colorants include covalent metallic chelate compounds, e.g., copper ethyl acetoacetate.

Suitable dye or color-forming components which form colored compounds on the application of heat or when brought in contact with other color forming components on a separate support, include:

(1) *Organic and inorganic components.*—Dimethyl glyoxime and nickel salts; phenophthalein and sodium hydroxide; starch/potassium iodide and oxidizing agent, i.e., peroxides; phenols and iron salts; thioacetamide and lead acetate; ethyl acetoacetate and cupric acetate, etc.

(2) *Inorganic components.*—Ferric salts and potassium thiocyanate; ferrous salts and potassium ferricyanide; copper, mercury or silver salts and sulfide ions; lead acetate and sodium sulfide.

(3) *Organic components.*—2,4-dinitrophenylhydrazine and aldehydes or ketones; diazonium salts and phenols or naphthols, e.g., benzenediazonium chloride and β-naphthol; substituted aromatic aldehydes or amines and a photographic color developing compound, e.g., p-dimethylaminobenzaldehyde and p - diethylaminoaniline; photographic color developing compound/active methylene compound and oxidizing agent, e.g., p-diethylaminotoluidine/α-cyanoacetophenone and potassium persulfate.

The dyes and color forming components used in this invention preferably have a relatively low optical density for the radiation used to expose and photopolymerize the monomeric compound.

The photopolymerizable composition is preferably coated on a base support. Support materials should be stable at the heating temperatures used in the instant invention. Suitable bases or supports include those disclosed in Plambeck U.S. Patent 2,760,863, col. 5, lines 14 to 33, glass, wood, paper, cloth, cellulose esters, e.g., cellulose acetate, cellulose propionate, cellulose butyrate, etc. and other plastic compositions. The support may have in or on its surface and beneath the photopolymerizable stratum an antihalation layer as is disclosed in said Plambeck patent.

The photopolymerizable layer is exposed to actinic radiation, generally through a photographic transparency, e.g., a negative or positive. Process transparencies, i.e., image-bearing transparencies consisting solely of substantially opaque and substantially transparent areas where the opaque areas are substantially of the same optical density, the so-called line or halftone negative or positive, are preferred, but continuous tone transparencies can also be used to produce tone gradation through variations in diffusion of the colorant. It is possible to expose through paper or other light transmitting materials. A stronger light source or longer exposure times must be used, however, reflex exposures can also be used, e.g., in copying from opaque originals, e.g., paper, cardboard, metal, etc., as well as from poor light-transmitting surfaces with no loss in speed, excellent resolution, and in addition, right-reading copies are obtained directly on transfer.

Good copies having high contrast and low stain are obtained using reflex techniques by adding small amounts of contrast-increasing sensitometric modifiers. Suitable compounds are disclosed in assignee's Heiart patent application Serial No. 186, 221, now Patent No. 3,203,801 and Burg patent application No. 186,222, now Patent No. 3,203,802 both filed April 9, 1962.

Since the preferred free-radical generating addition-polymerization initiators activatable by actinic radiation, e.g., 9,10-phenanthrenequinone, exhibit at least part of their sensitivity in the visible range, the radiation source should furnish an effective amount of this radiation. Such sources include carbon arcs, mercury-vapor arcs, fluorescent lamps, argon glow lamps, electronic flash units and photographic flood lamps. Of these, the mercury-vapor arcs, particularly the sunlamp type, and the fluorescent lamps, are most suitable. The sunlamp mercury-vapor arcs are customarily used at a distance of one and one-half to 20 inches from the photopolymerizable layer. Other initiators may require higher amounts of ultra-violet radiation to be effective. In such cases, the radiation source should furnish an effective amount of ultraviolet radiation. Many of the radiation sources listed above furnish the required amount of this radiation.

After the exposure of the photopolymerizable layer and removal of the cover sheet, where present, the exposed composition is brought into intimate contact with a separate receptor support. Suitable supports include paper, e.g., bond paper, resin and clay sized paper, resin coated or impregnated paper; cardboard; metal sheets and foils, e.g., aluminum, copper, steel, bronze, etc.; wood; glass; nylon; rubber; polyethylene; linear condensation polymers such as the polyesters, e.g., polyethylene terephthalate; regenerated cellulose; cellulose esters, e.g., cellulose acetate; silk; cotton; and viscose rayon fabrics. It is important that the receptor support be stable at the process temperatures. The particular support used is dependent on the desired use for the transferred image and on the receptivity of the base for the image.

The receptive support may have a hydrophilic surface or may contain on its surface chemical compounds which react with compounds being transferred so as to produce differences in color, hydrophilicity or conductivity between the receptor and the transferred underexposed areas or for improved adhesion or brightening of the receptive support. In those cases where monomeric compound is transferred to the receptor support it may be polymerized after the transfer operation by exposure to actinic radiation.

The sandwich formed by bringing the exposed photopolymerized surface and the receptor support in intimate contact is heated to effect the diffusion or sublimation of the dye in the areas corresponding to the underexposed, unpolymerized areas of the photopolymerizable composition. Heat is preferably applied simultaneously with the contact of the exposed element to the receptor support. It can be applied, however, at any stage of the process prior to the separation step to either or both elements provided the transfer temperatures are sufficient to cause the colorant to diffuse or transfer from the photopolymerizable composition. Heat can be applied by means well known to the art, e.g., rollers, flat or curved heating surfaces or platens; radiant sources, e.g., heating lamps, etc. The heating temperatures and contact periods vary with the different types of photopolymerizable compositions used. The temperature generally ranges from 50 to 300° C. and the contact time from 0.1 to 60 seconds.

The process of this invention embodies selective diffusion of a colorant through a binder rather than mass transfer of colorant with binder. The upper temperature limit for the elements and process is less restrictive than in thermal transfer processes such as those of U.S. Patent 3,060,023. In the latter processes, the temperature used for transfer of underexposed areas cannot exceed the temperature at which the exposed areas would also transfer. While colorant diffusion can occur at relatively low temperatures, e.g., 50° C., it will often be desirable to accelerate the diffusion rate by operating at relatively high temperatures, e.g., above 220° C. This is quite possible in accordance with the present invention provided one selects binders and supports which are high melting or non-thermoplastic and also chemically stable at the diffusion temperature. Other components such as the colorant or monomer need not be high-melting but should be chemically stable at these temperatures; in fact, melting of a colorant may be desirable for aiding diffusion. With some monomers it may be necessary to use thermal inhibitors to prevent polymerization at the higher temperatures.

This invention is useful for a variety of copying, printing, decorative and manufacturing applications. Multicopies of the images can be obtained. The number of copies prepared is dependent on the composition thickness and colorant concentration as well as process conditions. The process is also useful for preparing multicolor reproductions. Colorless colorants which form colored compounds when heat is applied or brought into contact with other color forming compounds are useful in the transfer process. Reflex exposure can be used for any of these applications provided the base support is transparent, and is especially useful in copying from poorly or non-light transmitting supports, e.g., paper, cardboard, etc.

Lithographic surfaces can be produced by transferring a hydrophobic layer to a hydrophilic receptor surface or vice versa. The images on the lithographic surface can be made impervious to chemical or solvent attack by post-exposing the lithographic surface.

The process of this invention can also be used to prepare resists, e.g., for the preparation of gravure plates or for printed circuits.

The process of this invention has the advantage that by a simple, inexpensive procedure, involving the use of light and heat in a dry system, copies of images which are of high quality and stability are obtained rapidly.

An additional advantage of this invention is that multiple copies can be obtained with layers much thinner than those used in thermal transfer processes operating above the tack temperature. Good tonal quality can be obtained by the diffusion process of the invention where the colorant diffuses to the receptor sheet in proportion to the exposure, thereby making possible smooth, continuous tone reproduction.

I claim:

1. A dry process for image transfer which comprises

A. placing into interfacial contact the surfaces of an image-receptive element and an addition polymerizable solid layer consisting of (1) underexposed areas in said solid layer comprising ($x$) at least one non-gaseous ethlenically unsaturated compound containing at least one terminal ethylenic group, having a boiling point above 100° C. at normal atmospheric pressure and being capable of forming a high polymer by photoinitiated addition polymerization, and ($y$) a diffusible colorant that diffuses at a temperature below that at which said layer becomes tacky and adherent to bond paper; and (2) complementary adjoining coplanar exposed image areas comprising an addition polymer of the aforesaid compound and said colorant, and B. heating at least one of the elements while they are in surface contact to a temperature sufficient for the colorant to diffuse through the underexposed areas of the layer but below that at which the layer becomes tacky and adherent to said image-receptive element whereby the colorant in the underexposed image areas diffuses and transfers to said element.

2. A process according to claim 1 wherein said colorant is a dye.

3. A process according to claim 1 wherein the solid layer is on a flexible polymeric film base.

4. A process according to claim 1 wherein the steps A. and B. are repeated several times, using a separate image-receptive element each time, so that a plurality of images which are copies of the underexposed image areas are obtained, each on a separate image-receptive element.

5. A dry process for image transfer which comprises

A. placing into interfacial contact the surfaces of an image-receptive element and an addition polymerizable solid layer consisting of (1) underexposed areas in said solid layer comprising (a) at least one non-gaseous ethylenically unsaturated compound containing at least one terminal ethylenic group, having a boiling point above 100° C. at normal atmospheric pressure and being capable of forming a high polymer by photoinitiated addition polymerization, (b) a polymeric binder having a tack temperature at least as high as the layer, (c) a diffusible colorant that diffuses at a temperature below that at which said layer becomes tacky and adherent to bond paper; and (2) complementary adjoining coplanar exposed image areas comprising an addition polymer of the aforesaid compound and said colorant, and B. heating at least one of the elements while they are in surface contact to a temperature sufficient for the colorant to diffuse through the underexposed areas of the layer but below that at which the layer becomes tacky and adherent to said image-receptive element, whereby the colorant in the underexposed image areas diffuses and transfers to said element, and C. separating the two elements.

6. A process according to claim 5 wherein said colorant is a dye.

7. A process according to claim 5 wherein said solid layer contains (d) an addition polymerization initiator activatable by actinic radiation and inactive thermally below 85° C.

8. A process according to claim 5 wherein said solid layer contains (d) an addition polymerization initiator activatable by actinic radiation and inactive thermally below 85° C., and (e) an addition polymerization inhibitor.

9. A process according to claim 5 wherein constituent (a) is diffusible below the temperature at which the layer becomes tacky and adherent to a receptive surface.

10. A dry image-forming process which comprises (i) exposing, imagewise, with actinic light a photopolymerizable element comprising a support bearing a solid photopolymerizable layer comprising (*x*) at least one non-gaseous ethylenically unsaturated compound containing at least one terminal ethylenic group, having a boiling point above 100° C. at normal atmospheric pressure and being capable of forming a high polymer by photoinitiated addition polymerization, and (*y*) a diffusible colorant that diffuses at a temperature below that at which said layer becomes tacky and adherent to bond paper;

(ii) placing the surface of the exposed layer into contact with the image-receptive surface of a separate element;

(iii) heating at least one of the elements while they are in surface contact to a temperature below that at which the layer becomes tacky and adherent to a receptive surface whereby the colorant in the underexposed image areas diffuses and transfers to the receptive surface, and (iiii) separating the contacting surface of the two elements.

11. A process according to claim 10 wherein there is an oxygen barrier layer on the solid photopolymerizable layer.

12. A process according to claim 10 wherein the solid layer is on a flexible polymeric film base.

13. A process according to claim 10 wherein said colorant is a dye.

14. A process according to claim 10 wherein said solid layer contains (d) an addition polymerization initiator activatable by actinic radiation and inactive thermally below 85° C.

15. A process according to claim 10 wherein said solid layer contains (d) an addition polymerization initiator activatable by actinic radiation and inactive thermally below 85° C., and (e) an addition polymerization inhibitor.

16. A photopolymerizable element comprising a support bearing a solid layer having a tack temperature above 220° C. comprising a uniform mixture of:

(*x*) at least one non-gaseous, ethylenically unsaturated compound containing at least one terminal ethylenic group, having a boiling point above 100° C. at normal atmospheric pressure and being capable of forming a high polymer by photoinitiated addition polymerization; and (*y*) a diffusible colorant that diffuses at a temperature between 50° C. and 300° C. and below the temperature at which said layer becomes tacky and adherent to bond paper.

17. A photopolymerizable element comprising a support bearing a solid layer having a tack temperature above 220° C. comprising a uniform mixture of:

(a) at least one non-gaseous, ethylenically unsaturated compound containing at least one terminal ethylenic group, having a boiling point above 100° C. at normal atmospheric pressure and being capable of forming a high polymer by photoinitiated addition polymerization;

(b) a polymeric binder having a tack temperature at least as high as said layer, and (c) diffusible colorant that diffuses at a temperature between 50° C. and 300° C. and below the temperature at which said layer becomes tacky and adherent to bond paper.

18. An element according to claim 17 wherein said colorant is a dye.

19. An element according to claim 17 wherein said solid layer contains (d) an addition polymerization initiator activatable by actinic radiation and inactive thermally below 85° C.

20. An element according to claim 17 wherein said solid layer contains (d) an addition polymerization initiator activatable by actinic radiation and inactive thermally below 85° C., and (e) an addition polymerization inhibitor.

References Cited by the Examiner

UNITED STATES PATENTS

| | | | |
|---|---|---|---|
| 2,954,311 | 9/1960 | Van der Weel | 250—65.1 |
| 2,971,840 | 2/1961 | Haydn et al. | 96—29 |
| 3,012,885 | 12/1961 | Abbott et al. | 96—29 |
| 3,033,677 | 5/1962 | Abbott et al. | 96—29 |
| 3,060,023 | 10/1962 | Burg et al. | 96—28 |
| 3,088,028 | 4/1963 | Newman | 250—65.1 |
| 3,097,096 | 7/1963 | Oster | 96—115 |

FOREIGN PATENTS

| | | |
|---|---|---|
| 614,794 | 3/1962 | Belgium. |
| 878,149 | 9/1961 | Great Britain. |

OTHER REFERENCES

Mees, "Theory of the Photographic Process," 1954 Revised Edition, MacMillan Co., pp. 73–75 relied on.

Perry, "Chemical Engineers' Handbook," 3rd Ed., 1950, McGraw-Hill Book Co., pp. 538–541 relied on.

References Cited by the Applicant

UNITED STATES PATENTS

| | | |
|---|---|---|
| 2,503,758 | 4/1950 | Murray. |
| 2,503,759 | 4/1950 | Murray. |
| 2,552,209 | 5/1951 | Murray. |

J. TRAVIS BROWN, *Acting Primary Examiner.*

NORMAN G. TORCHIN, *Examiner.*

A. L. LIBERMAN, RONALD H. SMITH, *Assistant Examiners.*